United States Patent [19]

Kuroda et al.

[11] Patent Number: 5,274,793
[45] Date of Patent: Dec. 28, 1993

[54] AUTOMATIC LOGIC GENERATION METHOD FOR PIPELINE PROCESSOR

[75] Inventors: Rikako Kuroda, Tokorozawa; Tsuguo Shimizu, Sayama, both of Japan

[73] Assignee: Hitachi, Ltd., Tokyo, Japan

[21] Appl. No.: 489,917

[22] Filed: Mar. 7, 1990

[30] Foreign Application Priority Data

Mar. 8, 1989 [JP] Japan .................. 1-53802

[51] Int. Cl.$^5$ .................. G06F 15/20; G06F 15/60
[52] U.S. Cl. .................. 395/500; 364/488; 364/489; 364/DIG. 2; 364/916.3; 364/944.6; 364/948.34
[58] Field of Search .................. 364/DIG. 1, DIG. 2, 364/488, 489, 490, 578; 395/600, 700, 800, 500, 555, 575

[56] References Cited

U.S. PATENT DOCUMENTS

| | | | |
|---|---|---|---|
| 4,816,999 | 3/1989 | Berman et al. | 364/488 |
| 4,964,056 | 10/1990 | Bekki et al. | 364/488 |
| 4,965,758 | 10/1990 | Sherman | 364/488 |
| 5,005,136 | 4/1991 | Van Berkel et al. | 395/700 |
| 5,073,855 | 12/1991 | Staplin et al. | 395/375 |
| 5,111,413 | 5/1992 | Lazansky et al. | 364/488 |
| 5,119,495 | 6/1992 | King | 395/700 |
| 5,133,069 | 7/1992 | Asato et al. | 395/800 |
| 5,163,016 | 11/1992 | Har El et al. | 395/500 |

FOREIGN PATENT DOCUMENTS 60-167060 8/1985 Japan .
60-204078 10/1985 Japan .
61-231670 10/1986 Japan .
63-24362 2/1988 Japan .

*Primary Examiner*—Thomas C. Lee
*Assistant Examiner*—John C. Loomis
*Attorney, Agent, or Firm*—Fay, Sharpe, Beall, Fagan, Minnich & McKee

[57] ABSTRACT

In automatically synthesizing pipeline control, a first circuit indicates the data holding status of a register in response to a circuit description. A second circuit designates the register to receive output of a preceding register in response to the first circuit. A third circuit designates the preceding register to receive input in response to the first circuit without a circuit that indicates the data holding status of the preceding register. Logic responds to: a first file storing circuit description and data propagation behavior; a second file storing register data holding condition and status; and a third file storing logic templates that indicate whether data can be stored by the register, data holding status of the registers, data holding cycles of the registers, and cancel condition of data holding by the registers. The logic templates are assigned for the registers stored in the first file based on the contents of the second file. The element number of the assigned template and mutual connections are defined based on the second file. Based on the second file, determination is made of those registers that may really develop resource conflict among the points where the data meet together and the points where the wait factors of the data transfers develop as well as only those registers which will be affected by the resource conflict. Logic is generated by assigning templates to the thus determined registers, making it possible to suppress the generation of redundant logic.

2 Claims, 15 Drawing Sheets

| # | BASE | SOURCE | SINK |
|---|------|--------|------|
| 1 | IN | - | REG A |
| 2 | REG A | IN | REG B |
| 3 | REG B | REG A | MEM |
| 4 | MEM | REG B | OUT |
| 5 | OUT | MEM | - |
| 6 | REGA-TMP10 | REGA-TMP11 REGA-TMP12 | * |
| 7 | REGA-TMP11 | REGA-TMP13-0 REGA-TMP13-1 | REGA-TMP10 |
| 8 | REGA-TMP12 | * | REGA-TMP10 |
| 9 | REGA-TMP13-0 | * | REGA-TMP11 |
| 10 | REGA-TMP13-1 | * | REGA-TMP11 |

FIG. 15(a)

| # | BASE | SOURCE | SINK |
|---|------|--------|------|
| 1 | IN | - | REG A |
| 2 | REG A | IN REGA-TMP10 | REG B |
| 3 | REG B | REG A REGB-TMP10 | MEM |
| 4 | MEM | REG B | OUT |
| 5 | OUT | MEM | - |
| 6 | REGA-TMP10 | REGA-TMP11 REGA-TMP12 TO | REGA(CK) |
| 7 | REGA-TMP11 | REGA-TMP13-0 REGA-TMP13-1 | REGA-TMP10 |
| 8 | REGA-TMP12 | * | REGA-TMP10 |
| 9 | REGA-TMP13 | REQ2&^REGB-TMP20 | REGA-TMP11 |
| 10 | REGA-TMP14 | REQ6&^REGB-TMP20 | REGA-TMP11 |

FIG. 15(b)

AUTOMATIC LOGIC GENERATION METHOD FOR PIPELINE PROCESSOR

BACKGROUND OF THE INVENTION

The present invention relates to a method of synthesizing logics for pipeline processors, and specifically to a method of synthesizing control logics for the registers.

A variety of means have been proposed to automatically design the logics with the increase in the scale of logics of very large computers and logic VLSIs. Methods of automatically synthesizing logics of Boolean level from the description of logic specifications at the initial stage of design can be found in Japanese Patent Laid-Open Nos. 167060/1985 and 204078/1985. In recent years, design of a pipeline control system has been widely used for improving the performance of computers, and it becomes more important to automatically design the logics for the pipeline computers.

Methods of synthesizing control logic circuits of the pipeline processor from the description of logic specifications in the initial stage of design are disclosed in Japanese Patent Laid-Open Nos. 128374/1986, 231670/1986 and 24362/1988. These methods generate logics for controlling the transfer of data so that the data is not lost due to resource conflict by analyzing the data path structure and by detecting the registers that may cause resource conflict. Resource conflict is a phenomenon in which the data transferred in parallel collide with one another at a point where the wait factor of the data transfer generates or at a point where the data meet together in a group of registers connected in plural stages. The condition in which the data are transferred in the block diagram of FIG. 2 is shown in a time chart of FIG. 4, to illustrate resource conflict.

Condition 430 denotes the condition in which the data D1 in the register B is waiting for transfer to the memory, and 420 denotes the condition in which the succeeding data D2 is transferred to the register A while the data D1 is moved to register B under the waiting condition. In this case, if it is attempted to transfer the data D2 from the register A to the register B in the third cycle, a resource conflict 440 generates in the register B.

Reference numeral 450 denotes a case where data D4 exists in the memory, and 460 denotes a case where data D3 exists in the register C in parallel with 450. A resource conflict 470 generates if it is attempted to write these data simultaneously onto the register D to which the data are to be transferred.

When the resource conflict generates, it becomes necessary to prevent the data from being lost by the collision of data. In order to prevent the resource conflict 440, for example with respect to data D1 moved from register A (510) to register B in FIG. 5, it becomes necessary to hold (520) the data D2 in the register A for two cycles until processing (530) of data D1 is finished in the register B at which time data D2 may be transferred to register B in cycle 4.

According to the prior art, a preceding register of a stage that precedes conflict register in which the data may meet together or in which the wait factor of the data transfers may develop is determined as the register that may generate resource conflict based upon the data path. In the data path shown in FIG. 2, a register B 230 in the preceding stage of the memory M 240 is the one that may generate resource conflict with the register C 250 in the preceding stage of the selector 260. Furthermore, the resource conflict caused in the register B 230 may affect the register C 250. The selector 260 is connected through register D 270 to the circuit output pin OUT 280. Register C receives data from input IN1 210. A control logic is automatically generated to control the data holding for those registers that may develop resource conflict.

SUMMARY OF THE INVENTION

According to the aforementioned prior art, the registers that may generate resource conflict have been determined based only upon the structure of the data path. The resource conflict may generate at every point where the data meet together and at every point where the wait factor generates in the registers of the preceding stage. In practice, however, the problem arises at only some of the points where the data meet together and at only some of the points where the wait factor of data transfers generate. With the method of the prior art, however, it is not possible to determine how the register of the preceding stage will be affected by the resource conflict.

In the block diagram of FIG. 2, for instance, if the system has been designed so that no data is allowed to enter through the input pin IN0 025 of a circuit block 200 when the data is held in the register B 230, then no resource conflict takes place for the registers A 220 and B 230. Therefore, probability of the resource conflict cannot be ignored in the prior art even for those resource conflicts that are not considered likely to take place. Moreover, the logic that indicates the data holding condition of the register is formed for all registers that may generate resource conflict, and the transfer of data is controlled based thereupon, resulting in the formation of a redundant control logic.

The object of the present invention is to correctly pick up the registers that generate resource conflict based upon the specifications of logic behavior. Therefore, the logic that indicates the data holding status of the register is formed at required places only, and the control logic can be generated maintaining improved efficiency.

The above-mentioned object is achieved by a logic description related to a pipeline processor that includes a plurality of registers continuously connected, wherein an automatic synthesis of pipeline control logic: synthesizes a first circuit that indicates the data holding status of a register as a control logic for the register in response to a circuit description and designates the logic circuit to receive new data when the register is not under the data holding status; generates a second circuit which designates the register to receive the output of the preceding register in response to the output of the first circuit; and generates a third circuit that designates the preceding register to receive input in response to the output of the first circuit as a control logic for the preceding register, without synthesizing a circuit that indicates the data holding status of the preceding register.

Specifically, the invention is concerned with a method of forming a logic that controls the data holding operation of the registers in response to the input of three kinds of files:

a first file storing information that represent a circuit description, including the constituent elements of a logic circuit and information on the behavior of data propagation;

a second file storing the data holding condition of the register and the data holding status of the register as operation information; and a third file storing four kinds of logic templates consisting of a first logic template that indicates whether the data can be stored by the register, a second logic template that indicates the data holding status of the registers, a third logic template that counts the data holding cycles of the registers, and a fourth logic template that indicates the cancel condition of data holding by the registers, as elements for constituting a logic that controls the behavior of data holding of the registers.

The logic templates of the third file are assigned for the registers stored in the first file based on the contents of the second file. The element number of the assigned template and relationships among the mutual connections are defined based on the contents of the second file, thereby to generate a control logic. The logic template is a circuit portion having a predetermined structure that is assembled from logics which frequently appear in a logic circuit that are stored in a library file.

Based on the data holding status of the registers and the data holding condition of the registers stored in the second file, determination is made of those registers that may really develop resource conflict among the points where the data meet together and the points where the wait factors of the data transfers develop as well as only those registers which will be affected by the resource conflict. Furthermore, the logic is generated by assigning logic templates of the third file to the thus determined registers, making it possible to suppress the generation of redundant logic for controlling the data holding to eliminate resource conflict.

BRIEF DESCRIPTION OF THE DRAWINGS

Further objects, features and advantages of the present invention will become more clear upon the following detailed description of preferred embodiments as shown in the drawing, wherein:

FIGS. 15(a) and 15(b) show functional logic files;

DETAILED DESCRIPTION OF THE PREFERRED EMBODIMENT

An embodiment of the present invention will now be described in detail in conjunction with the drawings.

Figure 1:
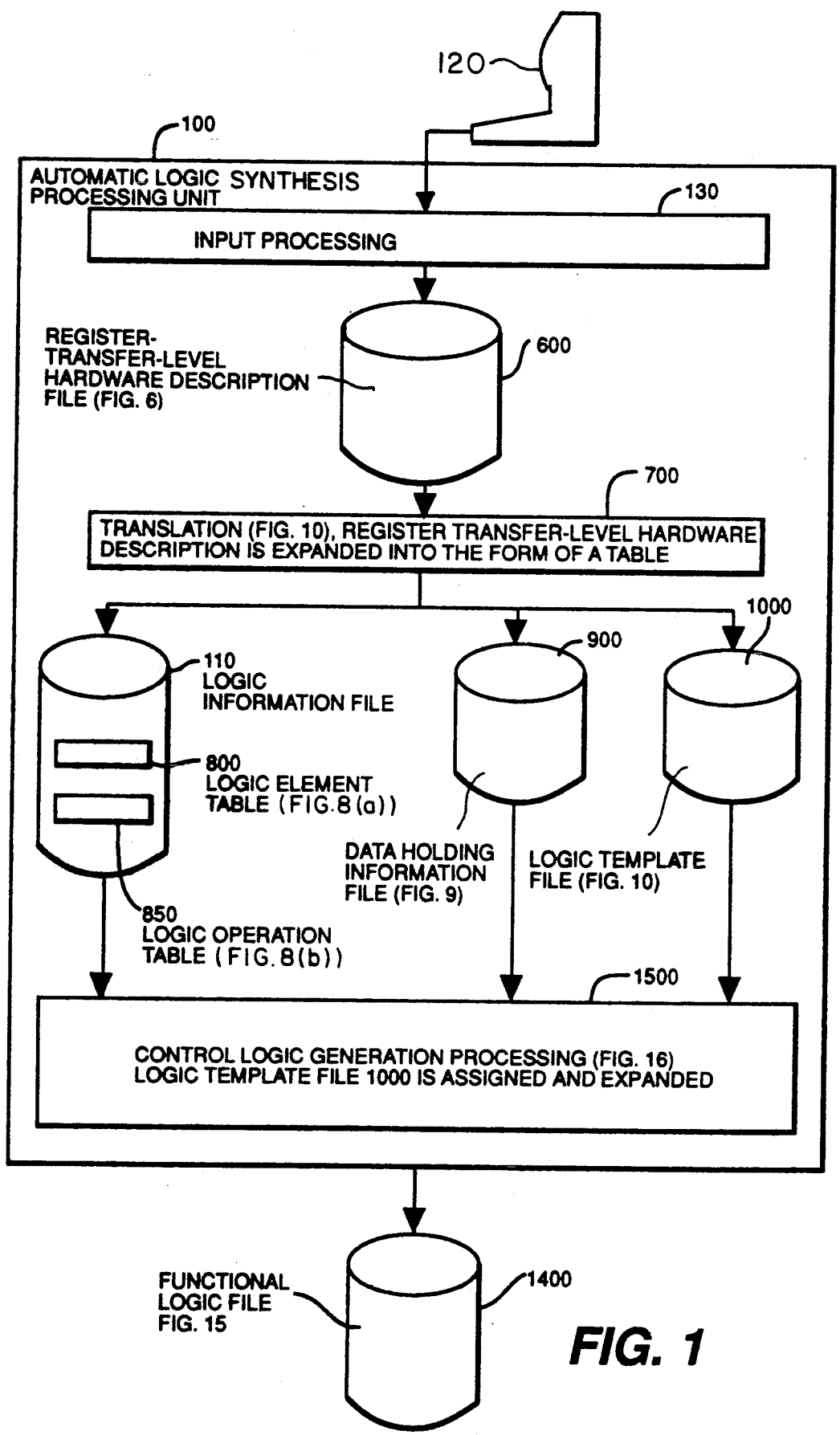
FIG. 1 is a flow chart illustrating the constitution of an automatic logic generation processing.

FIG. 1 is a diagram illustrating the processing for automatically synthesizing a logic according to an embodiment of the present invention. An input unit 120, such as a terminal, inputs the specifications of a logic that is automatically synthesized to an automatic logic synthesis processing unit 100, and input processing unit 130 edits input data from the input unit 120 and stores the data in a register-transfer-level hardware description file 600. Here, the register-transfer-level hardware description file 600, shown in detail in FIG. 6, expresses the specifications of a logic that is automatically synthesized in language description of a register-transfer-level. Automatic logic synthesis processing unit 100 automatically synthesizes a logic circuit for a pipeline control computer upon receipt of information in the register-transfer-level hardware description file 600. The functional logic file 1400 stores the Boolean level logic synthesized by the automatic logic synthesis processing unit 100 and is shown in FIG. 15. A translation processing unit 700 performs internal processing and converts the contents of the register-transfer-level hardware description file 600 into the form of a table as shown in FIG. 10,. Logic information file 110 and data holding information file (shown in FIG. 9) respectively 900 receive the logic information and data holding information prepared by the translation processing unit 700. The logic information file 110 has two kinds of tables, i.e., a logic element table 800 shown in FIG. 8(a) registering a logic circuit of a data system with a Boolean expression as a basic unit, and a logic operation table 850 shown in FIG. 8(b) registering the specifications of the logic behavior. The data holding information file 900 stores the data holding condition of the registers and the data holding status of the registers as information that indicates the data holding behavior of the registers in relation to the logic information file 110, and a logic template file 1000 stores the logic template file (FIG. 10) that constitutes logic for controlling the data holding behavior of the registers.

The logic template file 1000 stores four kinds of logic templates as shown in FIG. 10, i.e., a logic template number 1 that indicates the acceptability of new data for registers, a logic template number 2 that indicates the data holding status of the registers, a logic template number 3 that indicates the count of data holding cycles of the registers, and a logic template number 4 that indicates the cancel condition of data holding of the registers. Each template has a template base 1010, a template source 1020 and a template sink 1030. The signal holding status represents whether a register is holding currently effective data or not, and the acceptability of new data for registers represents a status where the register is not holding effective data, i.e., represents a status where new data can be or cannot be stored. The cancel condition of data holding is the condition for cancelling the data held by the registers.

The control logic generation processing unit 1500 of FIG. 1 and shown in detail in FIG. 16 generates a logic for controlling the data holding behavior of the registers upon input of three kinds of files 110, 900 and 1000. Based on the contents registered in the data holding information file 900, the control logic synthesis processing unit 1500 assigns logic templates of the logic template file 1000 for the registers in the logic information file 110. Based on the content of the data holding information file 900, furthermore, the control logic synthesis processing unit 1500 defines the element number of the assigned templates and a relationship of the mutual connections, in order to synthesis a control logic. Based upon information in the data holding information file 900, the presence or absence of resource conflict is determined for each of the registers, and logic templates in the logic template file 1000 are assigned in order to synthesize a logic.

Described below are four kinds of files input to or output from the automatic logic generation processing unit 100.

Figure 6A:
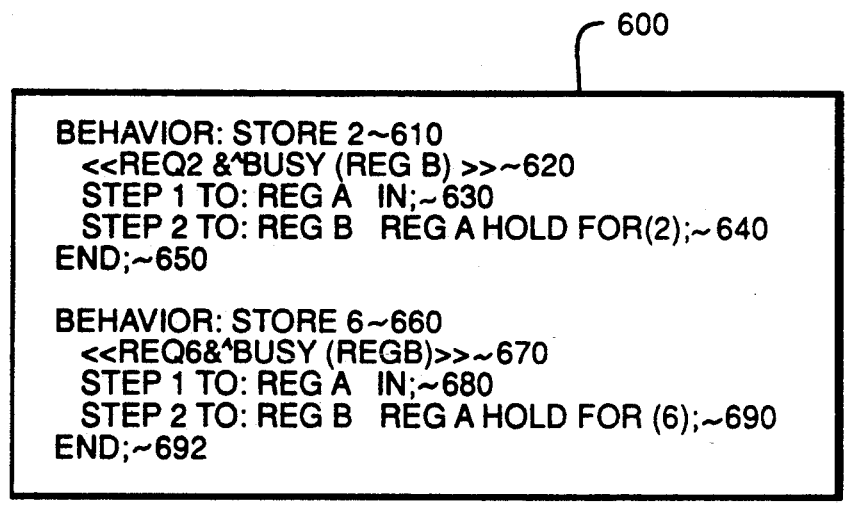
FIGS. 6(a) and 6(b) show examples of register-transfer-level hardware descriptions that will be input to the automatic logic generation system.
Figure 6B:
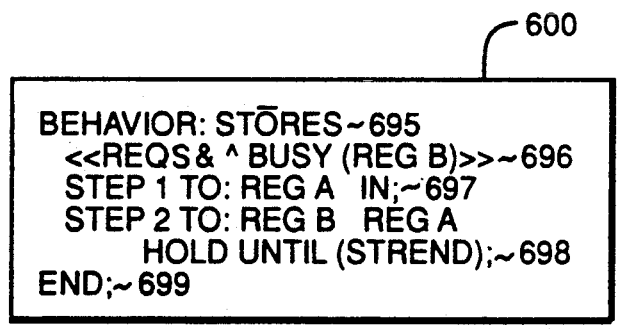

The register-transfer-level hardware description file 600 stores the specifications of the datapath structure determined in the initial stage in designing a computer and the specifications of logic behavior that shows the manner of data transfer. FIGS. 6(a) and 6(b) show specifications of the behavior of the register-transfer-level hardware. FIG. 6(a) shows the description of two kinds of logic behaviors consisting of a behavior STORE 2 of a program of sentences 610 to 650 and a behavior STORE 6 of a program of sentences 660 to 692 that are realized with the same hardware. REQ2& BUSY(-REGB) in the sentence 620 and REQ6& BUSY(-REGB) in the sentence 670 are conditions for starting the aforementioned two kinds of logic operations, namely STORE 2 and STORE 6, respectively. REQ2 and REQ6 are propositions of data demanding the start of the logic behaviors of STORE2 and STORE6. Symbols & and ∧ denote a product of propositions and a negation, and REGA and REGB denote register A and register B, respectively.

To: REGAIN; in the sentence 630 is a description of the basic behavior that data is transferred from an input pin IN to the register A at a timing To.

Figure 5:
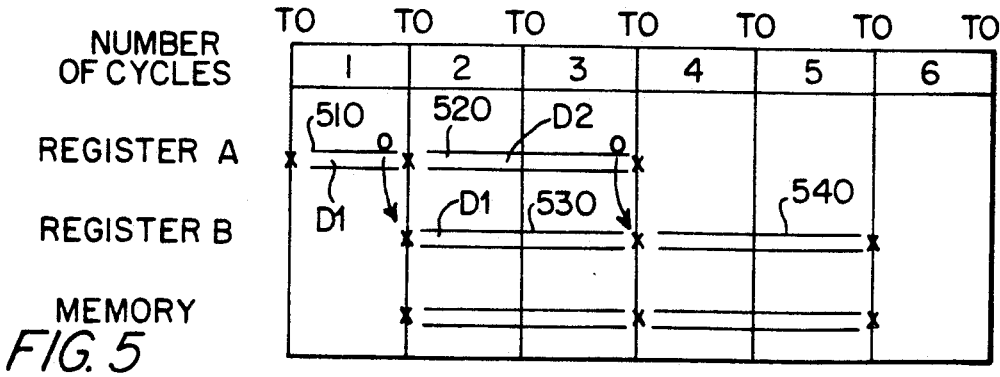
FIG. 5 is a time chart showing the specifications of logic behavior that is to be generated automatically.

BUSY(REGB) in the sentence 620 and HOLD FOR (2) in the sentence 640 are phrases describing the data holding behavior of the registers by the pipeline processor. In the sentence 620, BUSY(REGB) expresses, as a phrase, the condition where the register B is storing the data. In the sentence 640, HOLD FOR(2) is a phrase indicating that the data must be held for two cycles when the data are stored in the register B. The specification of logic given by the description of the behavior STORE 2 expresses a portion of the data path structure in which an input pin IN0 205, register A 220, register B 230 and memory M 240 are connected in series in the block diagram of FIG. 2, and expresses the time chart of FIG. 5. By using the phrase BUSY and the phrase HOLD FOR, the sentence 620 indicates that the behavior STORE2 is not driven even when the drive request REQ2 of behavior is established while the data are being held by the register B. The sentence 640 indicates that the data transferred from the register A to the register B must be held for two cycles. In this specification, the register A holds the succeeding data D2 in the third cycle in which the register B is holding the data as designated at 520 in FIG. 5: the register A, however, does not accept the next data in the third cycle as designated at 520. Such a complex logic behavior of the pipeline processor is simply expressed as a description from the sentence 610 up to the sentence 650.

When a cancel condition of data holding of the register is indicated by the data value, on the other hand, the description becomes as shown in FIG. 6(b). This is the description of logic operation for the data path structure of FIG. 2 similar to that of FIG. 6(a), and a behavior STORES is shown by sentence 695 through sentence 699. In the sentence 696, REQS& ∧ BUSY(-REGB) shows a condition for starting the logic operation, and REQS is a data requirement for requesting the start of the behavior STORES.

In the sentence 698, HOLD UNTIL (STREND) is a phrase used for describing the behavior for holding data of the registers in the pipeline processor like the phrase BUSY and the phrase HOLD FOR. The sentence 698 states that the data once stored in the register B is to be held until the data STREND holds.

The register-transfer-level hardware description file 600 has a feature in that the hardware behavior of the pipeline processor can be easily described.

The data holding information file 900 is prepared from the description of phrase BUSY, phrase HOLD FOR and phrase HOLD UNTIL in the register-transfer-level hardware description file 600. The logic information file 110 is prepared from other portions of the description in the register-transfer-level hardware description file 600.

Figure 8A:
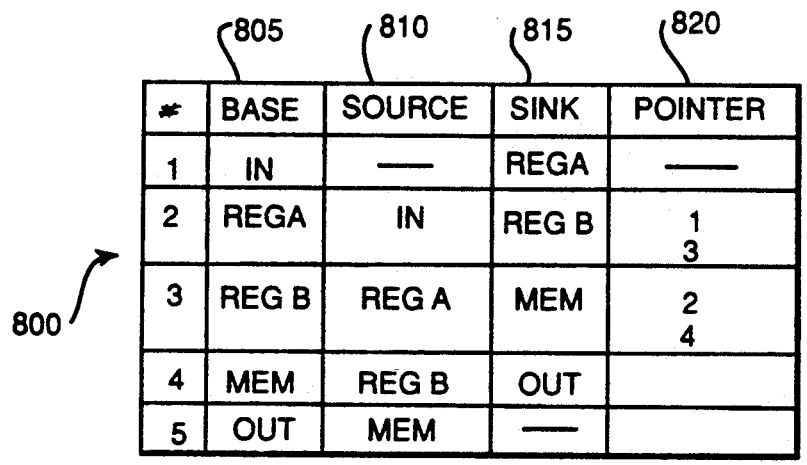
FIGS. 8(a) and 8(b) show logic data files of the automatic logic generation system.
Figure 8B:
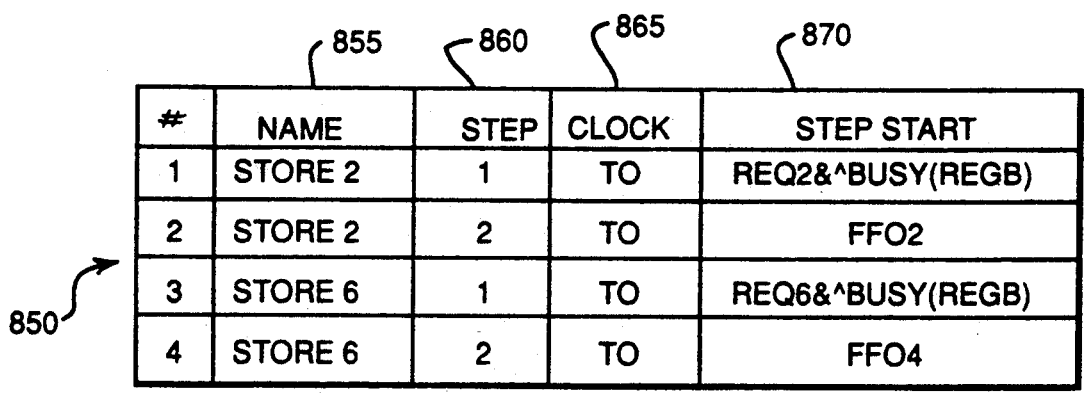

FIGS. 8(a) and 8(b) show data stored in the logic element table 800 and in the logic behavior table 850 that constitute the logic information file 110.

The logic element table 800 of FIG. 8(a) shows relationships of connections among the logic elements. The field 805 stores in each line the logic element base indicating logic elements that constitute a logic circuit. Onto the fields 810 and 815 are registered a logic element source and a logic element sink that indicate a source of data and a destination of data, respectively, of the logic element stored in the field 805. Onto the field 820 is registered a pointer of control logic generation information which points to a corresponding registration line in the logic behavior table 850.

The logic behavior table 850 of FIG. 8(b) stores information that indicates logic behavior of the logic elements. The field 855 stores sequence names to indicate names of logic behaviors. The field 860 stores step information that indicates sequence in the logic behavior. The field 865 stores clock information that indicates clock timings with which the transfer behavior operation is carried out. The field 870 stores step starting conditions that indicate conditions with which the behavior corresponding to the step is carried out.

Figure 9:
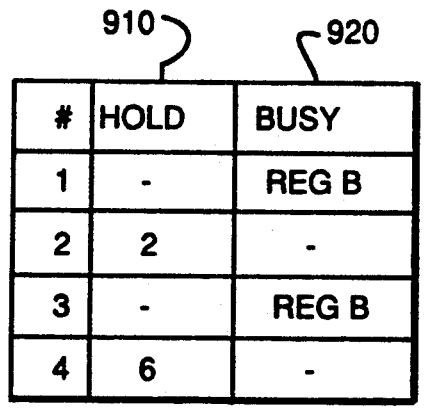
FIG. 9 shows a data holding information file.
Figure 10:
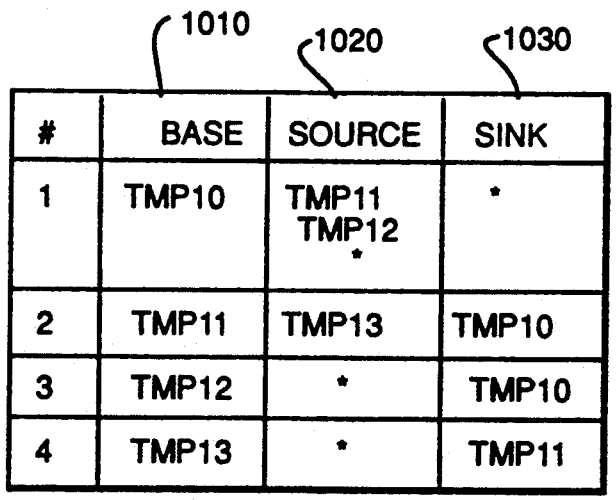
FIG. 10 shows a logic template file.

FIG. 9 shows a data holding information file 900 which consists of a plurality of lines corresponding to the logic behavior table 850 to store parameters described using the phrase BUSY, the phrase HOLD FOR and the phrase HOLD UNTIL. Entries of the data holding information file 900 correspond to entries of the logic behavior table 850 in a one-to-one manner. The hold information 910 is designated by using the phrase HOLD FOR at least how many cycles (indicated by a number in the field) the data be held by the destination register as the data holding condition for the transfer behavior of each of the entries of the logic behavior table 850, and stores a data name that indicates the cancel condition of data holding designated by the phase HOLD UNTIL though it is not diagramed in the information 910 of FIG. 9. When the Boolean expression of the step start condition 870 in the logic behavior table 850 has a phrase BUSY, the BUSY Information 920 registers the name for the register for which the phrase BUSY is described.

FIG. 10 shows an example of the logic template file 1000. The logic template is obtained by choosing a circuit portion having a predetermined structure from a logic that frequently appears in the logic circuit. Onto the field 1010 is registered a template base 1010 that indicates a logic gate which constitutes a logic template. A source of data and a destination of data corresponding to the template base 1010 are registered onto the template source 1020 and the template sink 1030, respectively. Inputs "*" are registered onto the fields 1020 and 1030 where the fields are not defined by the templates. Four kinds of logic templates are stored in the logic template file 1000. The logic templates will now be described.

Figure 11:
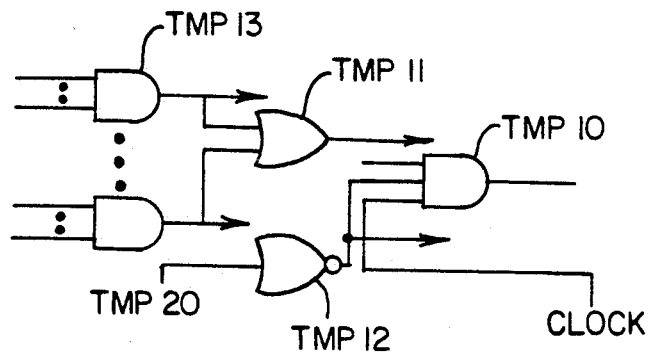
FIG. 11 shows a logic template 1.

FIG. 11 shows a logic template number 1 for correcting set conditions of a register as a concrete example of logic registered to the logic template file 1000.

Figure 12:
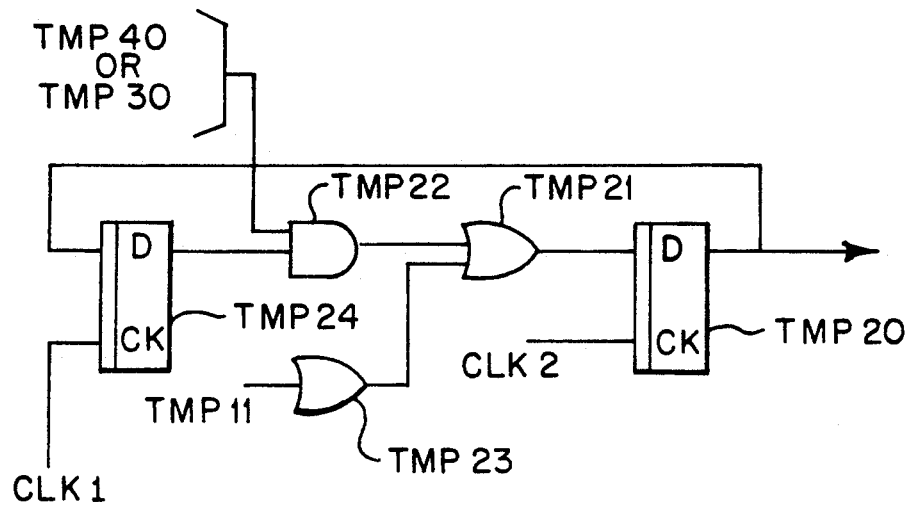
FIG. 12 shows a logic template 2.

FIG. 12 shows a logic template number 2 for indicating the data holding status of the register CLK1 is a clock delayed relative to the register by half a phase and CLK2 is a clock in phase with the register.

Figure 13:
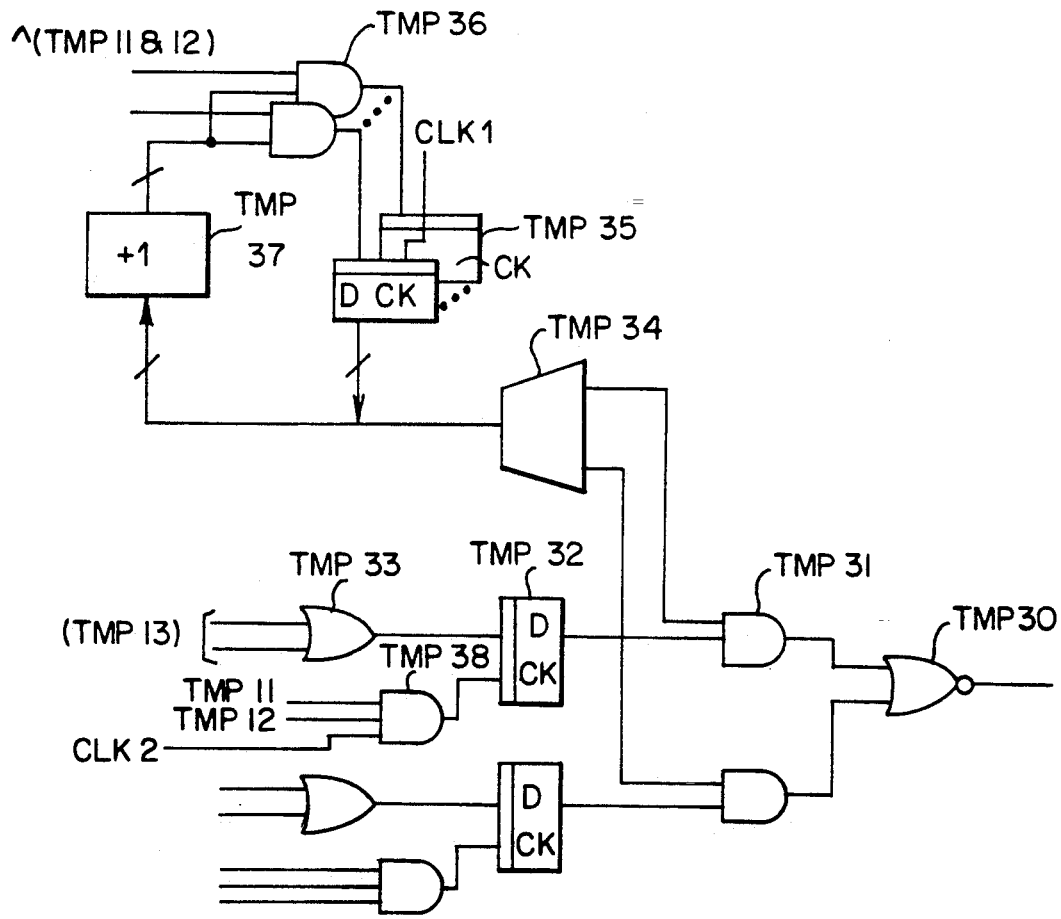
FIG. 13 shows a logic template 3.

FIG. 13 shows a logic template number 3 which indicates the cancel condition of data holding by counting the data holding time (cycles) of the register TMP 34 is a decoder, TMP 37 is an adder and (TMP13) is the transfer behavior condition.

Figure 14:
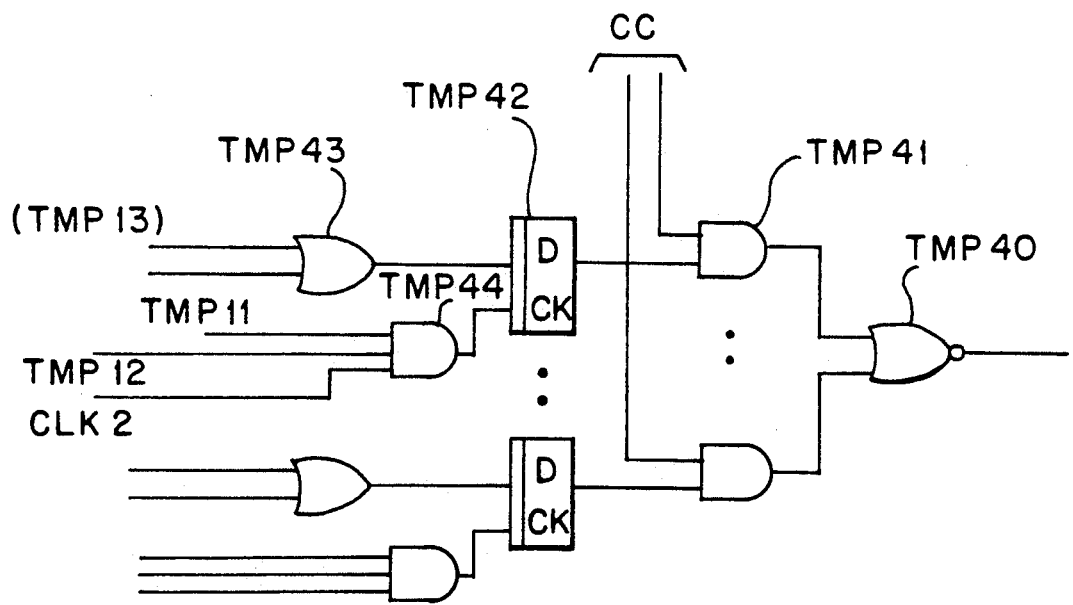
FIG. 14 shows a logic template 4.

FIG. 14 shows a logic template number 4 which indicates that the data is formed to represent the cancel condition of data holding of the register at TMP40, and (TMP 13) is the transfer behavior input.

In the logic template number 1 of FIG. 11, the TMP 13 is expanded into a number to meet the transfer behavior conditions of each of the registers and uses the transfer behavior conditions as sources of data. The TMP 11 finds the sum of propositions of the TMP 13 that is expanded. The TMP 12 is a logic gate that indicates the utilization of the register, and uses, as a source of data, a signal that represents the data holding status of the register, i.e., uses, as a source of data, the output TMP 20 from the logic template number 2 shown in FIG. 12. The TMP 10 is a gate of a product of propositions using TMP 11, TMP 12 and a clock signal as sources of data. The logic template number 1 is a formulation of logics that consist of (transfer behavior condition) and (clock signal) and (register utilization) that are connected to the clock pins of the register.

The contents registered to the file that corresponds to the logic template of FIG. 11 are represented by the lines 1 to 4 in FIG. 10.

The logic template number 2 shown in FIG. 12 is a logic that depicts the data holding status of the register. The TMP 20 is a flip-flop which latches the logic consisting of (data is held in the previous cycle) and (cancel condition of data holding does not hold true)! (new data is set) in the same clock phase as the register. Here, symbol ! denotes the sum of propositions. Output of the TMP 20 indicates the data holding status of the register, i.e., indicates whether the register is now holding the data or not. The TMP 24 is a flip-flop which latches the output of the TMP 20 with a clock that is lagged by half phase behind the TMP 20. The output of the TMP 24 is a signal that indicates the data holding status of the register of one cycle before. The TMP 22 is a gate of a product of propositions using, as a source of data, the TMP 30 of a logic template number 3 of FIG. 13 that is a signal indicating the cancel condition of data holding or using the TMP 40 of a logic template number 4 of FIG. 14. The TMP 23 is a gate of the sum of propositions which inputs TMP 11 of the logic template number 1 of FIG. 11 to indicate that new data is set to the register. The TMP 21 is a gate of a sum of propositions using TMP 22 and TMP 23 as sources of data, and produces an output that is connected to the data pin of the TMP 20.

FIG. 13 shows a template of a logic which counts the number of data holding cycles of the register and indicates whether a designated number of data holding cycles have finished or not. TMP 35, TMP 36 and TMP 37 denote templates of logics for counting the data holding cycles, TMP 35 and TMP 36 having a bit width $<\log_2 N>$ ($<>$ is a symbol indicating that the numerals on the right side of the decimal point are all rounded up) for maximum data holding cycles N of the register. The TMP 35 is a flip-flop which is in phase with the register and which indicates the number of cycles in which the data is now being held. The TMP 36 is a gate for finding a product of logics which receives the negation of the TMP 37 and the TMP 11 and TMP 12 of the logic template number 1 of FIG. 11, and which initializes the content of the TMP 35 when a new data is set. The TMP 37 is an adder circuit which adds 1 to a value that is indicated by input data consisting of n bits, and produces the value as data consisting of n bits. The TMP 34 is a logic circuit of a decoder which decodes the content of the TMP 35. The TMP 31, TMP 32, TMP 33 and TMP 38 have a bit width to meet the number of kinds of data holding cycles of the registers. For example, if there are two kinds of data holding cycles, i.e., two cycles and six cycles, the bit width becomes two bits. The TMP 33 collects the transfer behavior conditions for each of the data holding cycles. If the transfer behavior condition for the data having two cycles data holding is the TMP 13 in FIG. 11, the TMP 33 uses the TMP 13 as the source of data. The TMP 38 is a gate of a product of propositions which uses the same set condition as that of the register as a source of data. The TMP 11, TMP 12 and a clock in phase with the register serve as sources of data for the TMP 38. The clock pin of TMP 32 uses the TMP 38 as a source of data, and its data pin uses the TMP 33 as a source of data. The TMP 31 is a gate of a product of propositions for indicating a logic consisting of (data is transferred) and (data holding cycles of the transferred data are finished), and uses the TMP 32 and TMP 34 as sources of data. The TMP 30 is a gate of a sum of propositions to find a sum of propositions of the TMP 31, and its output indicates whether the data holding cycles of the register are finished or not.

The logic template number 4 shown in FIG. 14 is a logic which indicates the cancel condition of data holding of the register, and wherein TMP 41, TMP 42, TMP 43 and TMP 44 have a bit width corresponding to the number of kinds of the cancel conditions of data holding of the registers. For example, when there are specified two kinds of cancel conditions for data holding, the bit width becomes two bits. The TMP 43 collects the transfer behavior conditions for each of the cancel conditions of data holding. The TMP 43 uses the TMP 13 as a source of data when the transfer behavior condition for the data is TMP 13 in FIG. 11 with the cancel condition of data holding being STREND as designated at 698 in FIG. 6(b). The TMP 44 is a gate of a product of propositions for collecting the set conditions same as those of the register. The TMP 42 is a flip-flop which is clocked under the same conditions as the register, and its clock pin uses TMP 44 as a source of data and its data pin uses TMP 43 as a source of data. The TMP 41 is a gate of a product of propositions which indicates a logic consisting of (data is transferred) and (cancel condition of data holding is established for the transferred data), and uses the TMP 42 and a signal CC such as STREND indicating the cancel condition of data holding as sources of data. The TMP 40 is a gate of a sum of propositions which finds the sum of propositions of TMP 41, and its output indicates whether the cancel condition of data holding is established or not.

Figure 17:
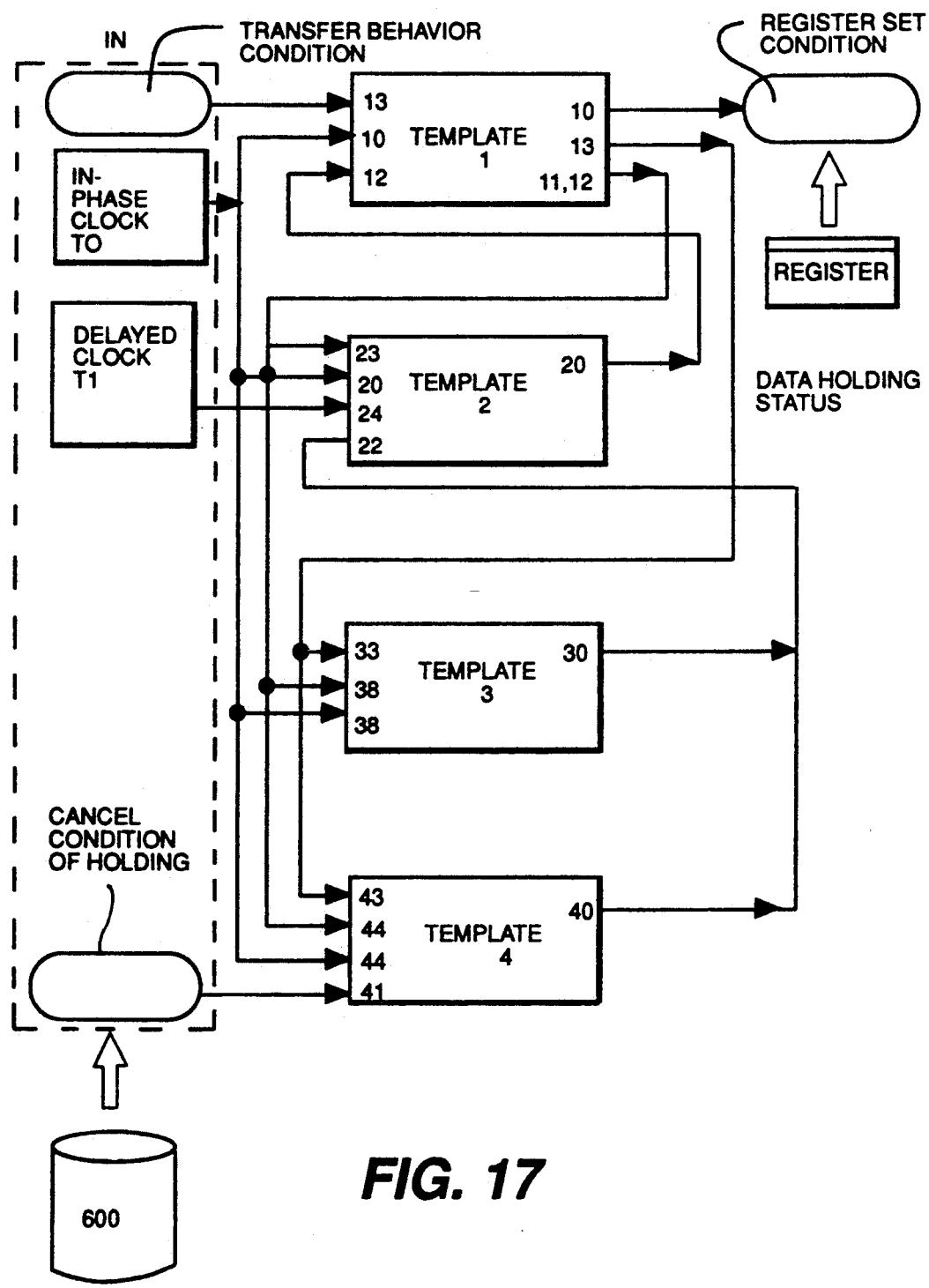
FIG. 17 shows a connection relationship among four kinds of logic templates.

FIG. 17 shows a relationship of connections among the aforementioned four kinds of logic templates. Four kinds of logic templates receive transfer behavior conditions included in the register-transfer-level hardware description, and control the outputs of set conditions of the registers. Combinations of the logic templates are changed depending upon the contents of the register-transfer-level hardware description.

The logic templates shown in FIGS. 12, 13 and 14 are registered to the logic template file 1000 shown in FIG. 10 like the logic template of FIG. 11.

Figure 16A:
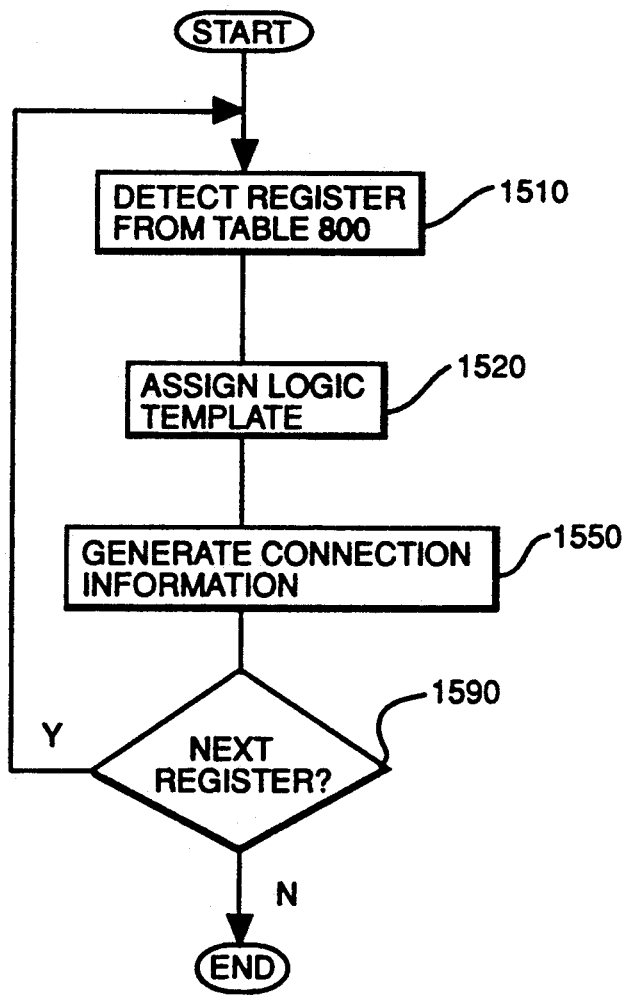
FIGS. 16(a), 16(b) and 16(c) show flow charts of the control logic generation processing.

FIGS. 15 (a) and (b) show examples of data stored in the functional logic file 1400. To the contents of the functional logic file 1400 are registered the results that generate control logic in addition to the logic circuit shown in the logic element table 800. In FIG. 15(a), sentences #1 to #5 are the same as the correspondingly numbered sentences of the logic element table 800. FIGS. 15(a) and 15(b) exemplify contents registered to the functional logic file 1400 at a stage where the processes 1520 and 1550 (described later) for synthesizing the control logic shown in FIG. 16(a) are finished.

Figure 7:
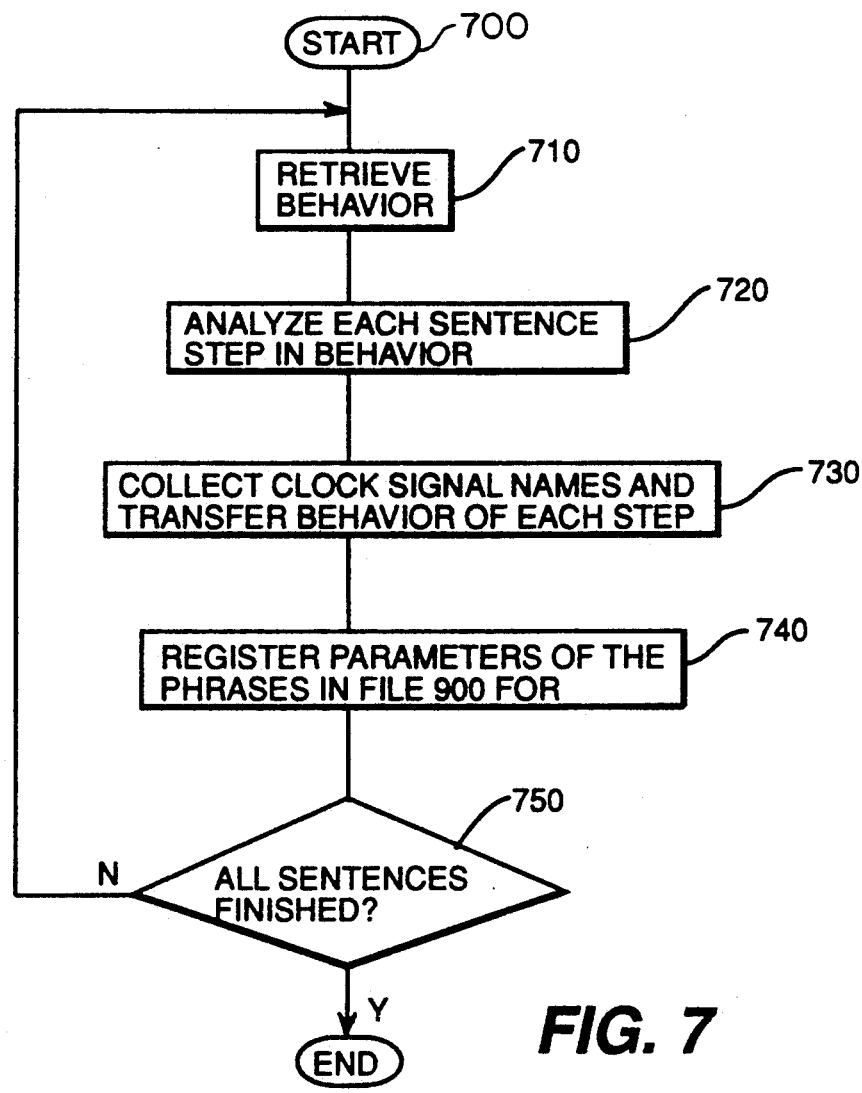
FIG. 7 is a flow chart of a translation processing.

Described below is the processing which translates the description of the register-transfer-level hardware description files 600 shown in FIGS. 6(a) and 6(b) into the form of a table and registers it into the logic element table 800, logic operation table 850 and data holding information file 900 based on the flow chart of the translation processing unit 700 shown in FIG. 7. The process 710 is a preprocessing in the translation processing and reads the register-transfer-level hardware description file 600 shown in FIGS. 6(a), 6(b), to retrieve the sentence BEHAVIOR to END. The process 720 and the subsequent processes are carried out to translate a series of sentences of BEHAVIOR and to store data in the logic information file 110 and in the data holding information file 900. The process 720 analyzes the connection relationship of logic elements based on the description of transfer behavior of each of the sentences STEP, and registers it to the logic element table 800. For example, from:

STEP 1 TO: REGA<-IN;

STEP 2 TO: REGB<-REGAHOLD FOR(2);

of the sentences 630 and 640 in FIG. 6(a), IN is analyzed as a source of REGA and REGB is analyzed as a sink, and the results of analysis are registered to the logic element base 805, logic element source 810 and logic element sink 815 as shown in the second line of the logic element table 800 of FIG. 8.

The process 730 further retrieves the sentence STEP is described transfer behavior for each of the logic elements that are destinations of transfer registered to the logic element base 805. This process further collects the behavior names of the transfer behaviors, the step numbers, the clock signal names, and the transfer behavior conditions from the sentence STEP, and registers them to the logic behavior table 850. For instance, the sentence 630 analyses STORE 2 as the behavior name to be transferred to the REGA, analyses 1 as the step number, analyses To as the clock signal name, and analyses REQ2 & ∧ BUSY(REGB) as the transfer behavior condition. The logic behavior table 850 shows on its line 1 the registered results of analysis of the sentence 630. In order to demonstrate that the content of the line 1 is the registered transfer condition for REGA, a pointer 1 to the first line of the table 850 is registered to the field 820 of the logic element table 800. The sentence 640 analyses To as a clock signal name and further analyses the output data of when REQ2 & ∧ BUSY(REGB) is latched with To by a flip-flop while calling the output data FF02, since the transfer behavior condition is one cycle after the REQ2 & ∧ BUSY(REGB) has held true, i.e., since the transfer behavior condition takes place after the STEP 1 is executed. These data are then registered to the clock 865 on the second line of the logic behavior table 850 and to the step start condition 870 with the data of FF02 that may exist or not as the step start condition.

In response to the entries of the logic behavior table 850 and based on the descriptions of phrases BUSY, HOLD FOR, and HOLD UNTIL, the process 740 carries out the processing to register the parameters possessed by the phrase to the data holding information file 900. For instance, REGB is registered to the first line of the busy information 920, in FIG. 9, due to the phrase BUSY of the sentence 620. Due to the phrase HOLD FOR of the sentence 640, furthermore, parameter 2 is registered to the second line of the hold information 910. When the translation processing is carried out for FIG. 6(b), STREND as the parameter is registered to the hold information 910 due to the phrase HOLD UNTIL. The aforementioned processing of FIG. 7 is carried out for all sentences BEHAVIOR in the file, under control of steps 750, to finish the registration to the logic information file 110 and to the data holding information file 900.

Figure 2:
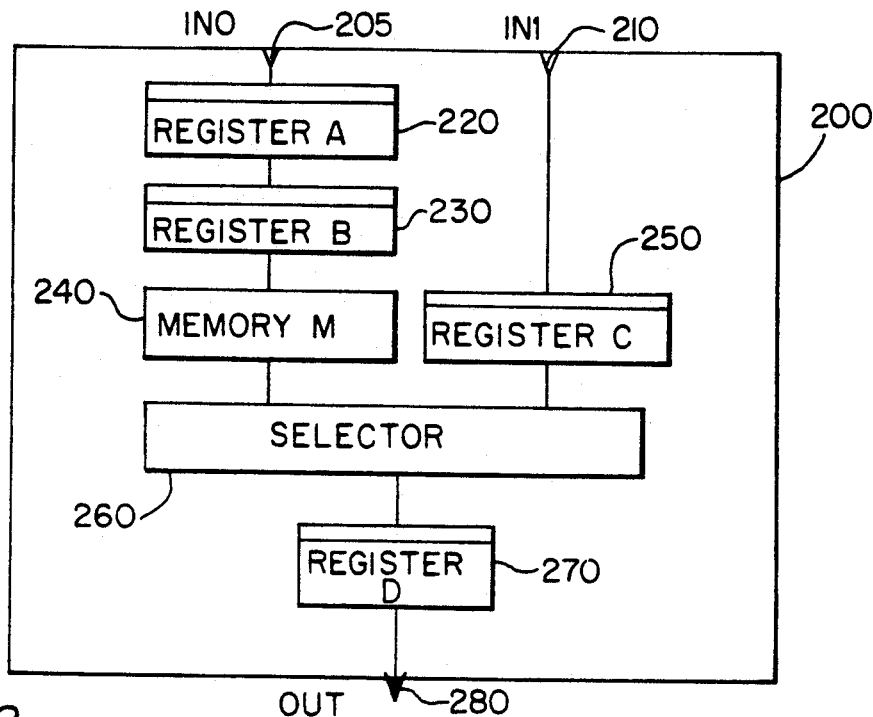
FIG. 2 shows a model of a simple logic system that is to be generated automatically.

Described below is the method of automatically synthesizing a transfer control processor of the pipeline control system effected by the control logic synthesis processing unit 1500 that automatically synthesizes a logic using the file explained above. A portion of the logic system 200 of FIG. 2 is a circuit for automatic synthesis. Among the data path of the logic system 200, attention is given to a portion constituted by the data input pin IN0 205, register A 220, register B 230 and memory M (240) to carry out automatic designing. In this logic system, the data once stored in the register B must be held at least two cycles such that the data set to the register B is allowed to make reference to the memory and read the data. The specifications of behavior of this logic system are shown in the time chart of FIG. 5, and the description of the specifications of behavior is shown in FIG. 6(a). Correspondence between the behavior specifications shown by the time chart and the description was mentioned already in the description of FIG. 6(a).

Figure 3A:
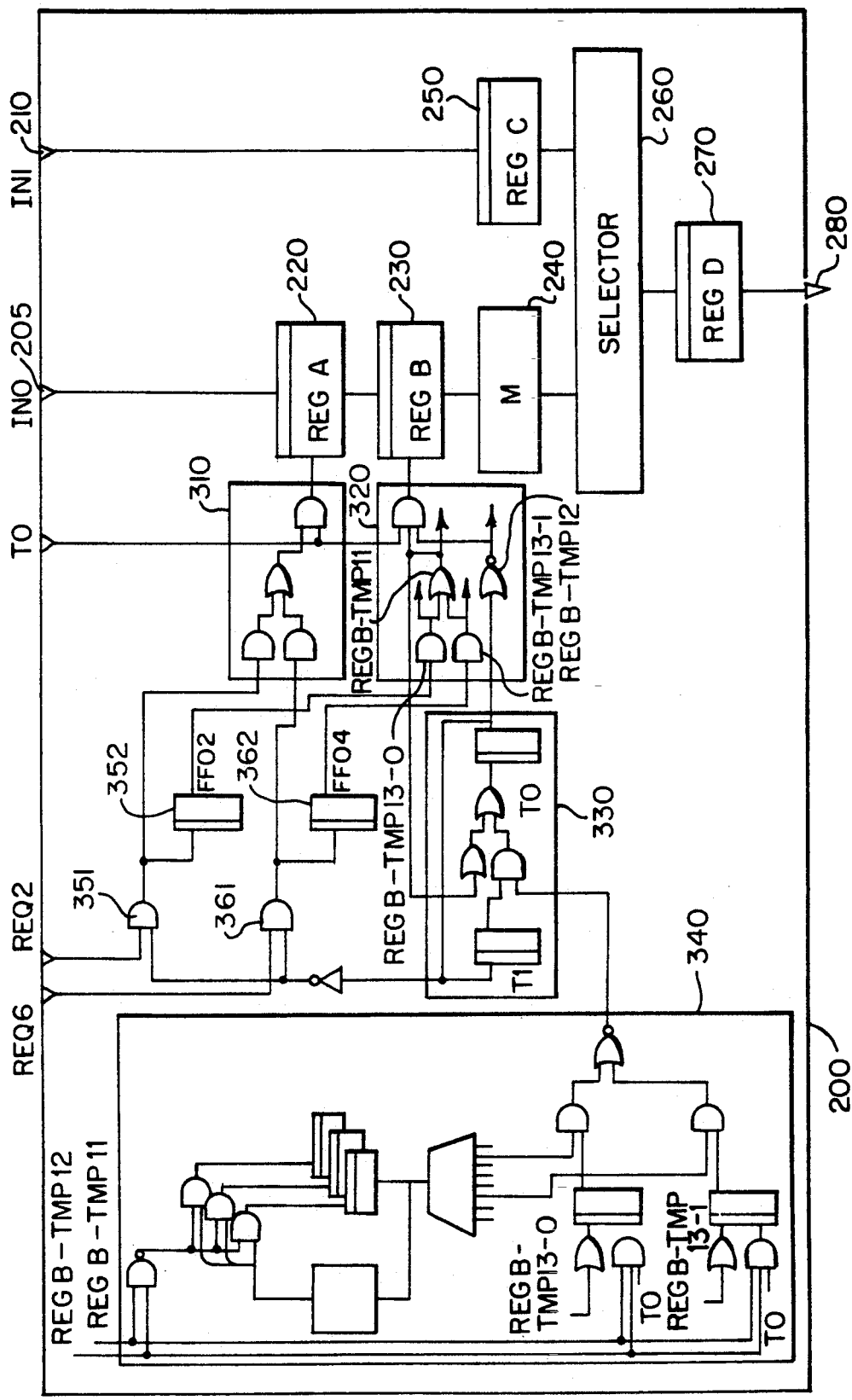
FIGS. 3(a) and 3(b) show the results of synthesizing control logics for the logic system of FIG. 2.

FIG. 3(a) shows the result of synthesizing the control logic shown in FIG. 6(a) for the logic system of FIG. 2. The template number 1 of circuit 310, template number 1 of circuit 320, template number 2 of circuit 330 and template number 3 of circuit 340 are assigned as shown in FIG. 3(a) by the control logic synthesis processing unit 1500, in order to synthesize a logic. The template 1 is the one for synthesizing a set logic of the register shown in FIG. 11, and the templates 2 and 3 are the logics for effecting the data holding control shown in FIGS. 12 and 13, respectively. The template 2 is the logic that indicates the status of the register (whether new data is to be set or not), and the template 3 is the logic template which counts the passage of time after the data is stored in the register and which indicates whether the data holding time has finished or not. In FIG. 3(a), a gate 351 outputs a product of propositions indicating the start condition of the STORE 2, and flip-flop 352 starts the step 2 after one cycle has passed from the start of the STORE 2. A gate 361 outputs a product of propositions indicating the start condition of the STORE 6, and a flip-flop 362 is for starting the step 2 after once cycle has passed from the start of the STORE 6.

Figure 3B:
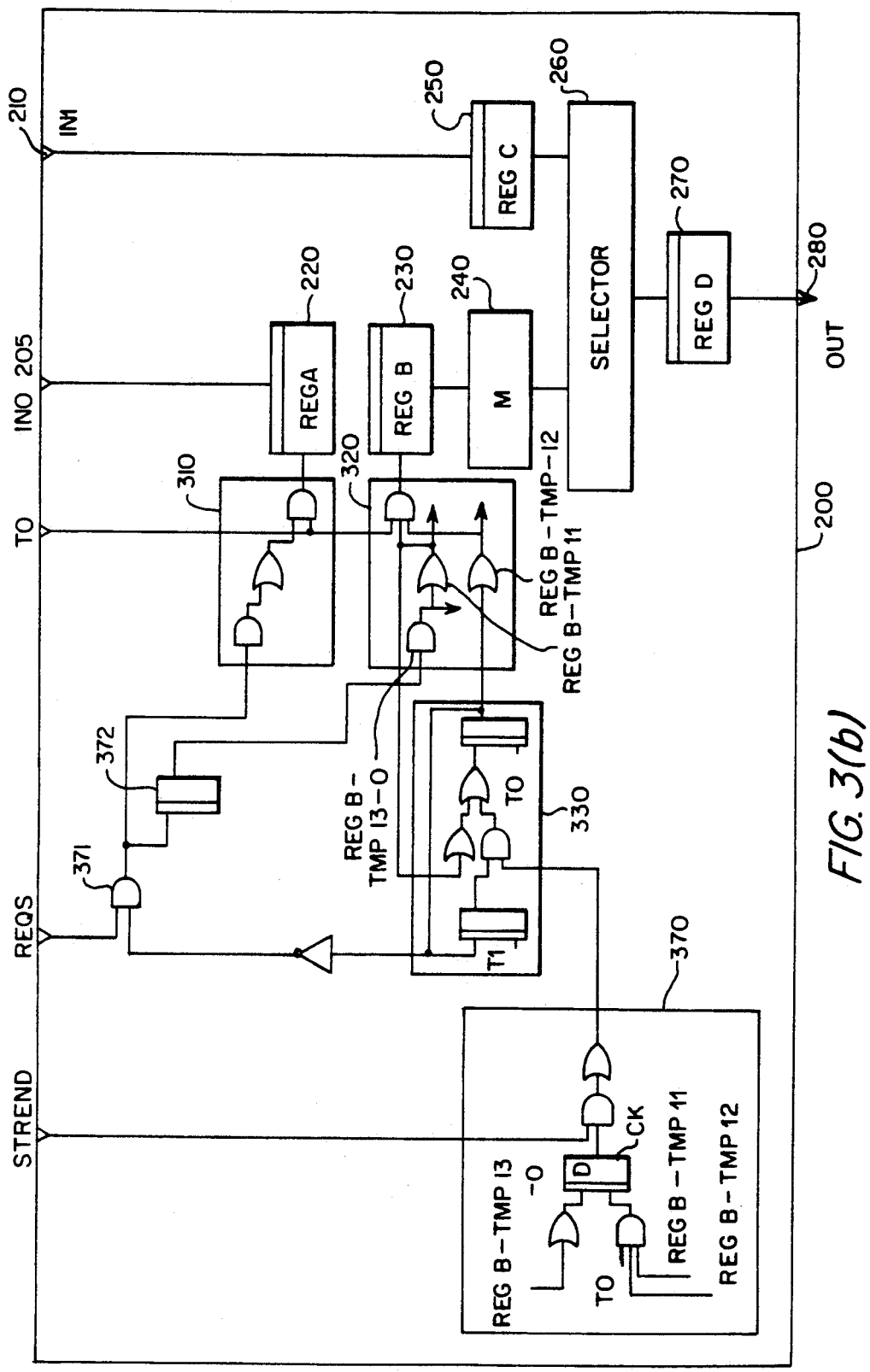

FIG. 3(b) shows the result of synthesizing a control logic for the description of FIG. 6(b) for the logic system of FIG. 2. In the description of FIG. 6(b), the cancel condition for data holding of the register B is different from that of FIG. 6(a) in regard to using the phrase HOLD UNTIL. In the processing of control logic synthesizing processing unit 1500 that will be described later, the template number 1 of circuit 310, the template number 1 of circuit 320, the template number 2 of circuit 330 and the template number 4 of circuit 370 are assigned as shown in FIG. 3(b) to generate a logic. The logic template 4 is the one that indicates whether the cancel condition of data holding of the register is established or not, and it has been described with reference to FIG. 14. Here, a gate 371 outputs a product of propositions that indicates the start condition of the STORES, and flip-flop 372 is for starting the step 2 after one cycle has passed from the start of the STORES.

Next, described below is a process for synthesizing control logics shown in FIGS. 3(a) and 3(b) for the logic system of FIG. 2 using the flow charts of FIGS. 16(a), 16(b) and 16(c). FIGS. 8 and 9 show the results of expansion of a register-transfer-level hardware description file 600 of FIG. 6(a) into tables through the translation processing. The process will now be described in detail based on the registered contents shown in FIGS. 8 and 9.

The process within the control logic generation processing unit 1500 for synthesizing a control logic is shown in FIG. 16(a). Process 1510 detects a register among the entries of the logic element table 800. Process 1520 assigns logic templates to the registers. Process 1550 generates connection information to determine a connection relationship of the assigned logic templates. Furthermore, the above-mentioned processes are repeated by a process 1590 until the logic element table 800 contains no register in which the control logic generation is unfinished.

Figure 16B:
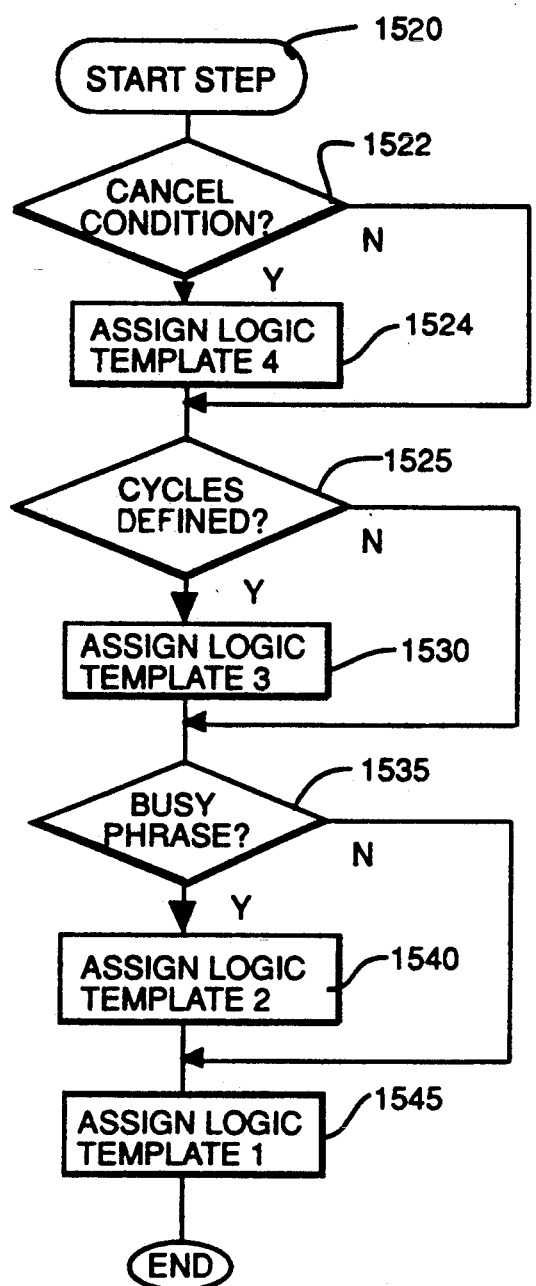

FIG. 16(b) is a flow chart of the process 1520 for assigning the logic templates. The process 1520 executes the assigning for each of the four kinds of logic templates.

The process 1522 determines whether the logic template 4 must be assigned to the register or not. The process 1522 effects the retrieval of the data that indicates whether the cancel condition of data holding has been defined or not for all hold information 910 (FIG. 9) of the data holding information file 900 that corresponds to the register being processed. When the cancel condition of data holding is defined, the process 1524 assigns the logic template number 4 as a control logic.

The process 1524 for assigning the template copies the content registered to the logic template file 1000 onto fields of FIGS. 15(a), (b), namely the logic element base 1410, logic element source 1420 and logic element sink 1430 of the functional logic file 1400. The TMP 41, TMP 42, TMP 43 and TMP 44 of the logic template 4 shown in FIG. 14 are expanded in number according to cancel conditions of data holding of the registers, and are registered to the functional logic file 1400. In the description of FIG. 6(a), no data value that indicates cancel condition of data holding has been given to the register B. In this process 1529, therefore, step 1524 is bypassed so that the logic template 4 is not assigned. In the description of FIG. 6(b), the data STREND is designated as a cancel condition of data holding, and the logic template 4 is assigned by steps 1522 and 1524. In this case, TMP 41, TMP 42, TMP 43 and TMP 44 of FIG. 14 are assigned one bit by one bit.

The process 1525 determines whether the logic template 3 needs to be assigned to the register being processed or not. The process 1525 effects the retrieval of information as to whether the data holding cycles are defined for all holding information 910 of the data holding information file 900 that corresponds to the register being processed. When the data holding cycles are defined, the process 1530 assigns the logic template number 3 as a control logic.

In the logic template number 3 shown in FIG. 13, there exist TMP 35 and TMP 36 in a number <Log2 N> (N: a maximum number of data holding cycles of the register), respectively, and the data holding cycles are replaced by the number of logic elements. The TMP 37 is replaced by an adder circuit which has an input of <log2 N> bits. The TMP 31, TMP 32, TMP 33 and TMP 38 are assigned after being expanded, respectively, into a number of the kinds of data holding cycles of the registers. In #2 and #4 of table 900 of FIG. 9, for example, the holding cycles are 2 and 6. As for the register B, therefore, TMP 35, TMP 36 and TMP 37 are expanded to <log2 6> = 3, respectively, and the number of the kinds of data holding cycles are two, therefore, TMP 31, TMP 32, TMP 33 and TMP 38 are expanded to 2, respectively.

The process 1535 determines whether the logic template number 2 needs to be assigned to the register being processed or not. Then there is no description that uses the phrase BUSY in the logic description for the register, the resource conflict that generates on the data structure is irrelevant to the data holding status of the register. Therefore, the process 1540 assigns the logic template number 2 only when registration is made to the busy information 920 of the data holding information file 900 that corresponds to the register being processed.

The process 1545 for assigning the logic template number 1 is effected for all registers being processed.

Owing to the above-mentioned processes, the logic templates are assigned as shown in the logic system 200 of FIG. 3(a). Parameters are registered to the lines 2 and 4 of the holding information 910 of FIG. 9 as behavior information for the register B, and names thereof are registered to the lines 1 and 3 of the busy information 920; therefore, the logic templates 1 (320), 2 (330) and 3 (340) are assigned. Furthermore, the logic template 1 (310) only is assigned to the register A that is registered to none of the fields.

FIG. 15(a) shows an example in which the logic template 1 is registered to the functional logic file 1400 as a control logic of the register A. Registered contents of entry numbers 1 to 5 of portions corresponding to the template 1 of the logic template file 1000 are copied onto entry numbers 6 to 10 of the functional logic file 1400. The portions designated at * in FIG. 15(a) have not yet been defined in this stage.

Figure 16C:
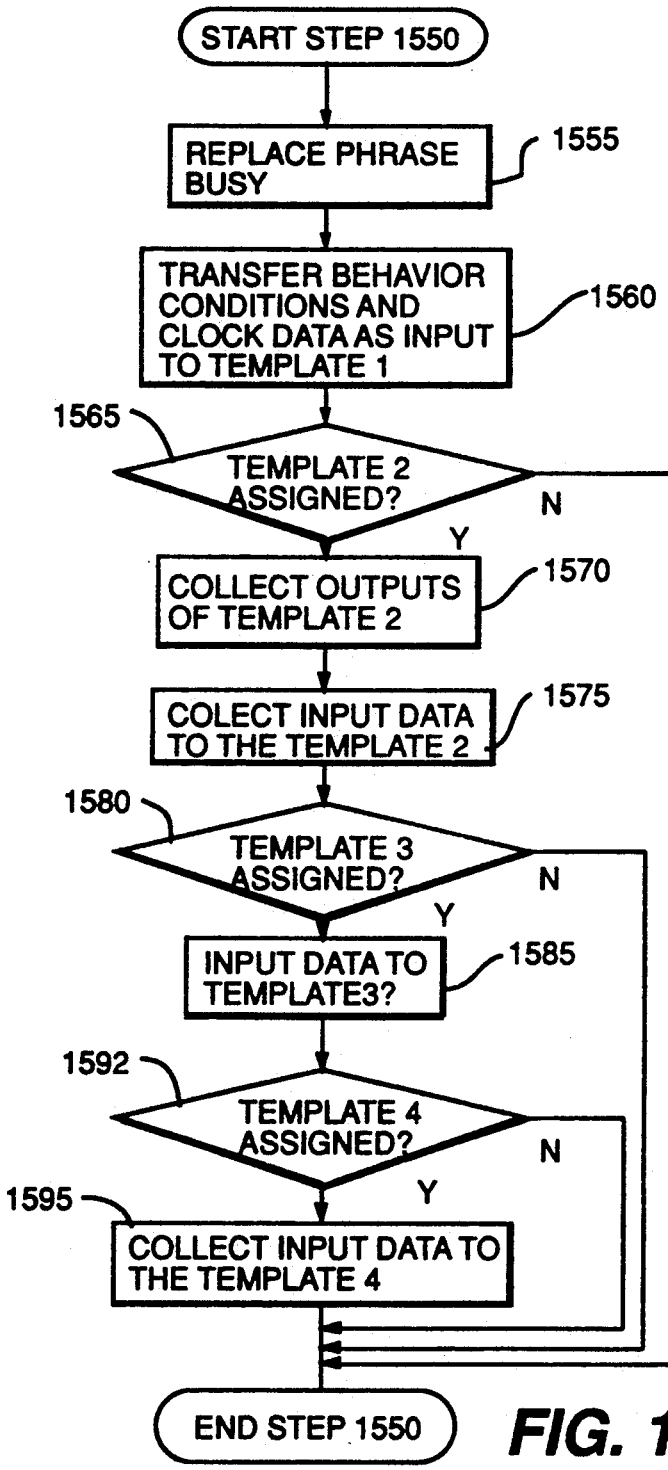

FIG. 16(c) is a flow chart of the connection information generation process 1550 of FIG. 16(a) which generate connection information of those portions where the connection relations have not been defined for the logic templates that are assigned to the registers by the logic template assigning process 1520. That is, this process effects the connection among the inputs, outputs and logic templates as shown in FIG. 17.

The process 1555 is directed to the phrase BUSY of the Boolean expression registered to the step start condition 870 of the logic behavior table 850 shown in FIG. 8(b). This process replaces the portion of the phrase BUSY by the output name of the logic template number 2 assigned to the register which is a parameter of the phrase BUSY. That is, this process 1555 replaces the logic that is abstractly expressed with the name of the real data. That is, this process 1555 replaces the phrase BUSY by the name of the real data for the logic expressions of entry numbers 1 and 3 that use the phrase BUSY in the step start condition 870 of FIG. 8(b). As a result of replacement, the entry 1 becomes REQ2-&∧REGB-TMP 20 and the entry 3 becomes REQ6-&∧REGB-TMP 20.

The process 1560 defines undefined portions (portions marked with * in FIG. 15(a)) among the input data of templates for the logic template number 1 that is assigned. This process collects transfer behavior conditions, step start conditions and clock data from the logic behavior table 850, and registers them to the portions * in the functional logic file 1400. In the example of FIG. 15(b), REQ2&∧REGB-TMP 20 is designated from the step start condition 870 as an input to the REGA-TMP 13-0 of entry 9 to which is registered the template that is assigned to the register A, REQ6& REGB-TMP 20 is designated as an input to the REGA-TMP 13-1 of entry 10 which is expanded element of TMP 13 of logic template number 1, clock data To is designated as a source of the REGA-TMP 10 of entry 6, and a clock pin of the REGA is designated as a sink. The input data are determined in the same manner for the REGB.

The process 1565 determines, for each of the registers, whether it is necessary to define connection information for the logic template number 2 that is a logic indicating the data holding status of the register. The process is completed in the case of the register A to which the template 2 has not been assigned. The processes after the process 1570 is executed for the register B to which the template 2 has been assigned.

The process 1570 collects data such as the output of template number 2 of portions that are required only when the template 2 is assigned, among the input data for the template 1. When the logic template 1 of FIG. 11 is assigned to the REGB, the REGB-TMP 20 (logic indicating the status of the register) which is an element of the template 2 of FIG. 12 is defined as a source of data that is input to the REGB-TMP 12. Through the above-mentioned processes, the connection information of logic templates 1 (310) and (320) of FIG. 3(a) is all defined.

The process 1575 collects the input data for the logic template number 2 and defines a connection relationship. For example, the outputs of template number 1, the outputs of template number 3 and clock data are collected. In the example of FIG. 3(a), this process collects the following data as an input to the logic gate of the template 2 assigned to the REGB and defines them as a source of data. This process defines clock data in phase with the register as a clock input to the TMP 20. REGB-TMP 11 is defined as a source of TMP 20. REGB-TMP 30 is defined if the template 3 is assigned as a source of the TMP 23, and REGB-TMP 40 is defined if the template 4 is assigned. The clock input of TMP 24 is a clock data T1 which is lagged by a half phase behind the register.

The process 1580 determines for each of the registers whether it is necessary to define connection information for the template 3. When the logic template 3 is assigned to the register, the process 1585 is executed. The processing, however, is finished when the logic template 3 is not assigned. Process 1585 is executed for the REGB.

The process 1585 collects input data for the logic template 3 and defines a connection relationship. When the logic template 3 of FIG. 13 is assigned to the REGB, the following data are collected from the logic behavior table 850 and are defined as a source of data. Clock data in phase with the register is defined as a clock input to the TMP 32 (0 :1) (indicates a first bit from 0 of the developed TMP 32). To the source of TMP 33 (0) (i.e., 0-th bit of TMP 33) is defined REGB-TMP 13-0 as a transfer behavior condition of the case where two cycles of data holding of the register are required. To the TMP 33(1) is defined REGB-TMP 13-1 as a transfer behavior condition of the case where two cycles of data holding of the register are required. To the source of the TMP 31(0) are defined TMP 32(0), data TMP 34(2) that indicates that two cycles have passed after the data holding, and data TMP 34(6) that indicates that six cycles have passed after the data holding. To the source of TMP 36 is defined a negation of REGB-TMP 11 and REGB-TMP 12. Through the abovementioned process, the connection relationship of the logic template 3 (340) of FIG. 3(a) is defined.

The process 159 determines for each of the registers whether it is necessary to define connection information for the template 4. When the logic template 4 has not been assigned to the register, process 1595 is not carried out. When the logic template 4 has been assigned to the register, process 1595 is executed.

Figure 4:
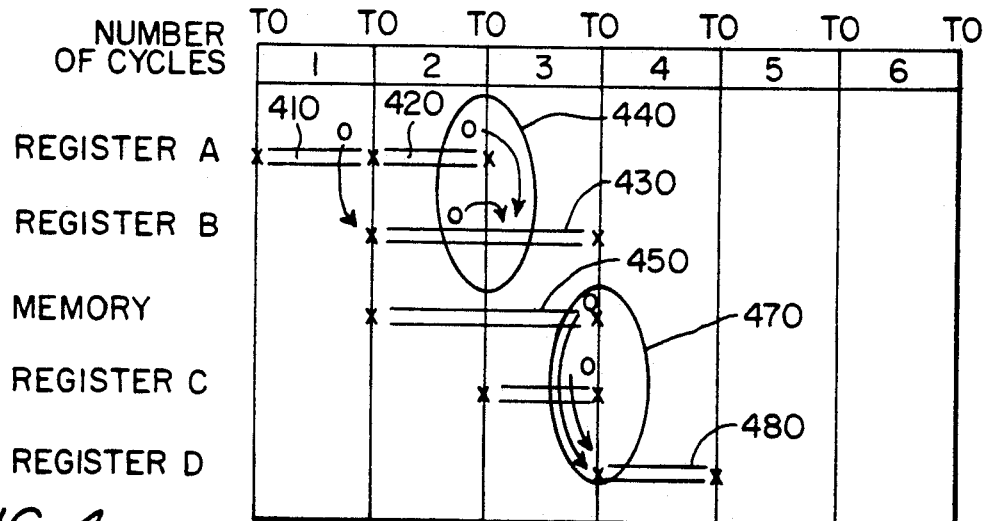
FIG. 4 is a time chart showing the nature of a control logic generated by the automatic logic generation process.

The process 1595 collects input data, such as outputs of templates, clock data and data names registered in the hold information 910, for the logic template 4 and defines a connection relationship. When the logic template 4 of FIG. 4 is assigned to the REGB of FIG. 3(b), the following data are collected from the logic behavior table 850 and are registered as a source of data. The REGB-TMP 11, REGB-TMP 12, and clock data To in phase with the register are defined as sources for the TMP 44. TMP 44 is defined for the clock input of TMP 42, and TMP 43 is defined for the data input thereof. To the source of TMP 43 is defined REGB-TMP 13 as a transfer behavior condition of the case where the cancel condition of data holding of the register is STREND. To the source of TMP 41 are defined TMP 42 and the data STREND that indicates the cancel condition of data holding. Through the above-mentioned processes, the connection relationship of the logic template shown in FIG. 3(b) is defined.

Through the above-mentioned processes, the control logics for controlling the data holding of the registers are all synthesized as shown in FIGS. 3(a) and 3(b).

The aforementioned method makes it possible to synthesize data transfer control logics in the pipeline processing based on effective description of the logic behavior using a reduced number of gates.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. In a method of automatically designing a pipeline control logic for a series of registers for data transfer through the registers in a pipeline manner according to a circuit description; comprising the steps:

maintaining a file for storing different kinds of logic templates representing corresponding logic circuits, each to be used with a register as part of a pipeline control logic for a series of the registers, including first, second and third logic templates, the first logic template representing a set up circuit that indicates whether data currently supplied can be sorted in a register, the second logic template representing a data holding status circuit that indicates whether data held by a register is valid or not, and the third logic template representing a detection circuit that indicates whether or not a data cancel condition has been met, and generates a signal which instructs changing of a status of data held by a register from a data-valid status to a data-invalid status, when the condition has been met, analyzing a circuit construction of a series of the registers for which a pipeline control circuit is to be designed, in response to the circuit description which describes, for each of the registers, a transfer operation of data from one of the registers or a data source other than the registers to that register or from a register to a data sink other than the registers, and identifying, as a result of the analyzing at least a first stage register among the registers which should receive data from said other data source, a final stage register among the registers which should provide data held by the final stage register to said data sink, and a data holding condition which should be satisfied by the final stage register before data held by said final stage register can be invalidated;

assigning the first logic template to each of the registers, as part of the pipeline control circuit to be designed;

assigning the second logic template selectively to the final stage register among said registers as another part of the pipeline control circuit to be designed;

assigning the third logic template selectively to the final stage register among said registers as further another part of the pipeline control circuit to be designed;

connecting the third logic template assigned to the final stage register to the second logic template assigned to the final stage register, so as to change a data holding status represented by the second logic template to a data-invalid status when the third logic template detects that the data cancel condition has been met by the final stage register;

connecting the second logic template assigned to the final stage register to the first logic template assigned to each of the registers so as to prohibit said first logic template assigned to said each register from supplying said each register with a set up signal when said second logic template assigned to said final stage register indicates that said final stage register is in a data-valid status; and determining a design of a pipeline control circuit from the assigned logic templates assigned by the three assigning steps according to connection determined by the two connecting steps.

2. A method according to claim 1, wherein the identifying step includes identifying a presence within the circuit description, of a statement which prohibits the registers from receiving data supplied from the data source during the final stage register holds valid data; and wherein the three assigning steps and the two connecting steps are executed when the presence of the statement within the circuit description has been identified.

* * * * *